(12) United States Patent
Stegmann et al.

(10) Patent No.: US 8,000,920 B2
(45) Date of Patent: Aug. 16, 2011

(54) PROCEDURE TO DIAGNOSE AN ELECTRICAL CIRCUIT

(75) Inventors: Volker Stegmann, Bretten (DE); Steffen Baierl, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/823,629

(22) Filed: Jun. 28, 2007

(65) Prior Publication Data

US 2008/0015806 A1    Jan. 17, 2008

(30) Foreign Application Priority Data

Jun. 29, 2006   (DE) .......................... 10 2006 029 992

(51) Int. Cl.
*G01R 27/28* (2006.01)
(52) U.S. Cl. ....................................................... 702/117
(58) Field of Classification Search .................. 702/117; 701/107, 110; 73/114.02, 114.2; 123/479, 123/478; 239/533.2
See application file for complete search history.

(56) References Cited

U.S. PATENT DOCUMENTS

| | | | |
|---|---|---|---|
| 5,284,118 A * | 2/1994 | Kato et al. ..................... | 123/478 |
| 6,285,947 B1 * | 9/2001 | Divljakovic et al. .......... | 701/110 |
| 7,243,532 B2 * | 7/2007 | Tsujimura et al. ......... | 73/114.02 |
| 2004/0107945 A1 * | 6/2004 | Yeo ............................... | 123/479 |
| 2004/0155121 A1 * | 8/2004 | Watanabe et al. .......... | 239/533.2 |

FOREIGN PATENT DOCUMENTS

| | | |
|---|---|---|
| DE | 40 12 109 | 10/1991 |
| DE | 199 19 126 A1 | 11/1999 |
| DE | 102 34 091 | 2/2004 |
| DE | 10 2005 008 180 A1 | 8/2006 |
| EP | 1 630 383 A2 | 3/2006 |

* cited by examiner

*Primary Examiner* — Drew A Dunn
*Assistant Examiner* — Xiuquin Sun
(74) *Attorney, Agent, or Firm* — Merchant & Gould P.C.

(57) ABSTRACT

Procedure to diagnose an electrical circuit for the operation of actuators of an internal combustion engine, in which the circuit is checked for electrical errors, and whereby information from a misfire recognition is additionally taken into account.

3 Claims, 3 Drawing Sheets

PROCEDURE TO DIAGNOSE AN ELECTRICAL CIRCUIT

TECHNICAL FIELD

The invention concerns a procedure to diagnose an electrical circuit for the operation of actuators of an internal combustion engine.

The invention furthermore concerns a device as well as a computer program to implement the procedure according to the invention.

BACKGROUND

Fuel injection valves for a high pressure as well as a low pressure direct fuel injection are basically known in the state of the art. They are typically designed as solenoid-controlled valves or piezo valves.

Fuel injection valves allocate the fuel mass to be injected into the cylinder, which is required for a clean and efficient combustion in the engine. The actuation of the fuel injection valves occurs typically by way of a power output stage, whereby the fuel injection is activated preferably by means of a so-called low side switch of the output stage.

The output stage is monitored during the operation so that short circuits are discovered to the battery terminal voltage and to ground of the output stage, and a response can be made to them.

From the German patent DE 102 34 091 A1, a procedure is, for example, known to monitor at least two electromagnetic valves. In the aforesaid procedure, the current supplied to the valves is measured and compared with a set point current. If the difference between the set point current and the actual current exceeds a threshold value, this is then recognized as a malfunction.

From the German patent DE 40 12 109 A1 a device is known for the functional monitoring of an electrical output stage, in which an error acquisition logic is connected in parallel to the output stage. Provision is made for the error acquisition logic to apply suitable electric potentials at different terminals of the output stage for the identification of an existing error in order, for example, to be able to differentiate an overload or short circuit to ground or to the positive terminal or additional possibilities of error.

SUMMARY

The procedure according to the invention to diagnose an electrical circuit, respectively an output stage for the operation of actuators of an internal combustion engine with the characteristics of the independent claim, has in contrast the advantage, in that in addition to an electrical check, information and/or signals of a misfire-recognition are taken into account.

When a breakdown of the electrical actuation of an actuator occurs, for example of a solenoid-controlled valve or a piezo valve, it can be assumed that the combustion in the combustion chamber of the affected cylinder also does not take place as expected and that misfires, respectively an irregular running, arise. The procedural approach according to the invention consequently has the advantage that an existing suspicion about an electrical error in the output stage, respectively circuit, can be confirmed by respectively observed misfires.

Advantageous modifications and improvements of the procedure put forth in the independent claim are possible by means of the steps listed in the dependent claims.

Provision is particularly made for an electrical error to only then be determined as a relevant error, if on the one hand the electrical error has been repeatedly registered and on the other hand misfires are to be observed. By means of such a procedural approach, error reports, which, for example, are randomly produced by electromagnetic irradiation, can advantageously be checked for relevancy by additional observation of the combustion for misfires.

Moreover, provision is made according to the invention for a shift to be made to an emergency driving operation (limp home mode) when a relevant error exists.

It is furthermore advantageous to reproduce this procedural approach according to the invention in a computer program product.

BRIEF DESCRIPTION OF THE DRAWINGS

Additional characteristics, possibilities of application and advantages of the invention result from the following description of examples of embodiment of the invention, which are depicted in the drawings.

The following are shown.

DETAILED DESCRIPTION

Figure 1:
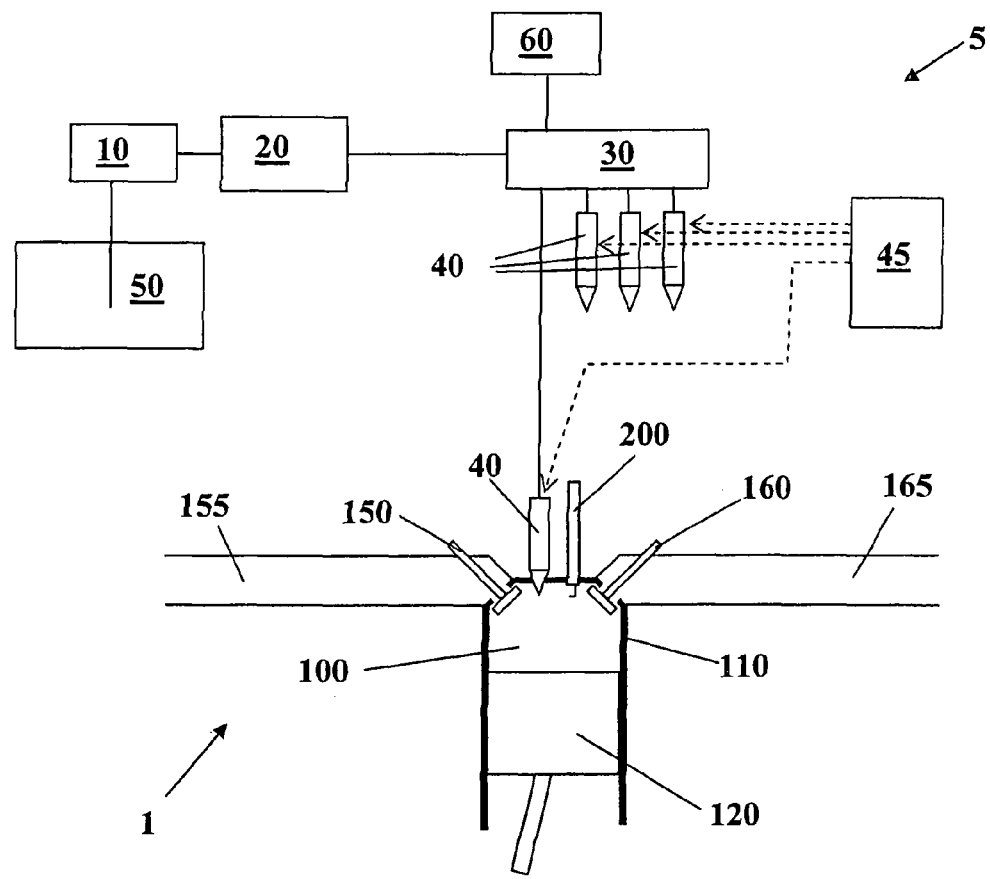
FIG. 1 shows schematically an internal combustion engine with a fuel injection assembly.

Actuators of an internal combustion engine and particularly fuel injection valves are typically actuated, respectively switched, by way of power output stages. In order to insure a safe and interference-free operation of the output stage, provision is made as a rule for functional monitoring, which examines the output stage with regard to, for example, short circuits to ground or to the positive battery terminal as well as electrical breaks.

The results of such a functional monitoring, respectively diagnosis, are preferably acquired and evaluated in a diagnostic device and/or in a control unit of the internal combustion engine.

The diagnosis is implemented, for example, cyclically, and the number of the errors, which occur, are acquired. If the number of errors exceeds an established error threshold value, for example two errors, it is assumed as a rule that probably a major error exists, and the corresponding actuating unit is deactivated. The internal combustion engine is then operated in a limp home mode with the remaining cylinders.

It is, however, to be observed that the electrical circuits in the motor vehicle, which are becoming increasingly more complex, are more and more burdened with and interfered by electromagnetic irradiation. Moreover, the electromagnetic forces increase due to the deployment of and especially the rapid pulsing of high currents, for example, for the operation of actuators and power train elements.

Therefore, it is not to be ruled out that the signals of a diagnostic device, the control unit or also the output stage are themselves so altered that an electrical error of the output stage is detected although an intact system exists. If such an error is repeatedly released during conventional diagnoses without further testing, the actuating unit is deactivated and switched into a limp home mode.

The invention emanates from the consideration that despite a faulty error diagnosis, the operation of the actuators and also of the output stage can be unimpaired. For this reason, provision is made according to the invention to observe an additional variable in addition to the electrical check of the output stage, respectively the corresponding circuit. This additional variable stands in a cause-effect relationship with the actuator to be activated.

A suspicion of error can be checked advantageously by means of the misfire recognition (ASE). The misfire recognition evaluates a so-called true running of the internal combustion engine, for example, by observing the chronological progression of the crankshaft angle or by observing the structure-borne noise of the internal combustion engine.

If the fuel injection actually does not occur as desired or it completely malfunctions, deviations from the crankshaft speed to be expected, and also changes in the structure-borne noise characteristics of the internal combustion engine are discernible.

The misfire recognition will immediately recognize misfires when a malfunction occurs in the fuel injection system—fuel injection valve, output stage, etc. As a result of the absence of the injection of fuel, the expected torque is missing, and the irregular running of the internal combustion engine increases dramatically. When an error in the fuel injection system and especially one in the output stage actually exists, the misfire recognition will denote a dramatically increasing, irregular running.

In the reverse instance, in which an assumed error is caused by electromagnetic irradiation, the internal combustion engine continues to run normally; and the misfire recognition cannot recognize an increase in the irregular running of the engine.

Consequently such an error suspicion can be discarded, and the fuel injection valve can continue to be operated.

Depending upon the application, differing threshold values can be set for a tolerable irregular running of the engine. The threshold values, for example, can especially be ascertained from the averaged irregular running values at operating points without a suspicion of error.

The invention is suitable for low pressure as well as high pressure fuel injection systems independent of the embodiments in the examples of embodiment.

A multi-cylinder internal combustion engine 1 with a fuel injection assembly 5 is depicted in FIG. 1, whereby four fuel injection valves 40 and one of the cylinders 110 are depicted as examples. The fuel injection assembly 5 comprises a first and second fuel pump 10, 20, a pressure accumulator 30, fuel injection valves 40, an output stage 45, a fuel tank 50 and a pressure sensor 60. The first fuel pump 10 pumps fuel from a fuel tank 50 in the direction of a second fuel pump 20. The first fuel pump 10 is suited for the purpose of producing a low pressure. The second fuel pump 20 feeds the fuel into a pressure accumulator 30 and increases the low pressure provided by the first fuel pump 10 to a high pressure. The pressure accumulator 30, also often designated as a fuel accumulator, rail or common rail, is in turn connected to four fuel injection valves 40. At least the pressure in the pressure accumulator 30 is monitored by way of a pressure sensor 60.

Serving as an example, one of the four fuel injection valves 40 is shown in connection with a cylinder 110 of the internal combustion engine 1. A piston 120 is disposed in a manner capable of motion in the cylinder 110. The cylinder has a combustion chamber 100, which is constrained among other things by the piston 120, an intake valve 150 and an exhaust valve 160. Provision can be made for multiple intake and/or exhaust valves 150, 160. In the area of the intake and exhaust valves 150, 160, an injection valve 40 and a spark plug 200 project into the combustion chamber 100. The injection valves 40 allow for a direct delivery of fuel into the combustion chamber 100 and are actuated by the output stage 45. The fuel in the combustion chamber 100 can be ignited by way of the spark plug 200. Furthermore, an intake manifold 155 preferably directs air onto the intake valve 150, and the air travels into the combustion chamber 110 by means of the opening of the intake valve 150. By means of the opening of the exhaust valve 160, exhaust gases are preferably directed further on into an exhaust gas pipe 165.

Figure 2:
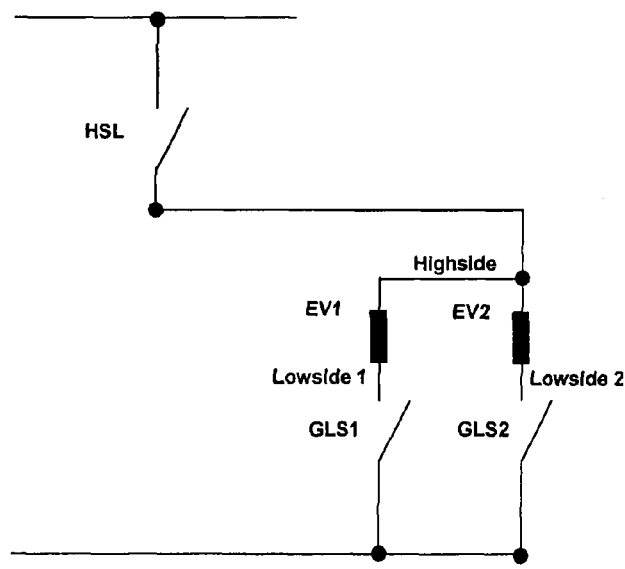
FIG. 2 shows schematically an output stage circuit for two fuel injection valves.

As part of an output stage 45, FIG. 2 depicts schematically a circuit of an output stage bank for two fuel injection valves EV1, 2 as actuators, which in the example at hand are symbolically represented as resistors. Of course provision can also be made for capacitive or inductive actuators, which, for example, are designed as piezo or solenoid-controlled valves.

Both actuators EV1, 2, which have in each case a terminal on the so-called high side, are connected to a feeder by means of a high side switching element HSL. On the other terminal side of the actuators EV1, 2, the so-called low side, the terminal of the first actuator EV1 is connected to a first low side switching element GLS1, and the terminal of the second actuator EV2 is connected to a second low side switching element GLS2, whereby both of the switching elements GLS1, GLS2 connect both of the actuators EV1, 2 to a common low side supply line.

Figure 3:
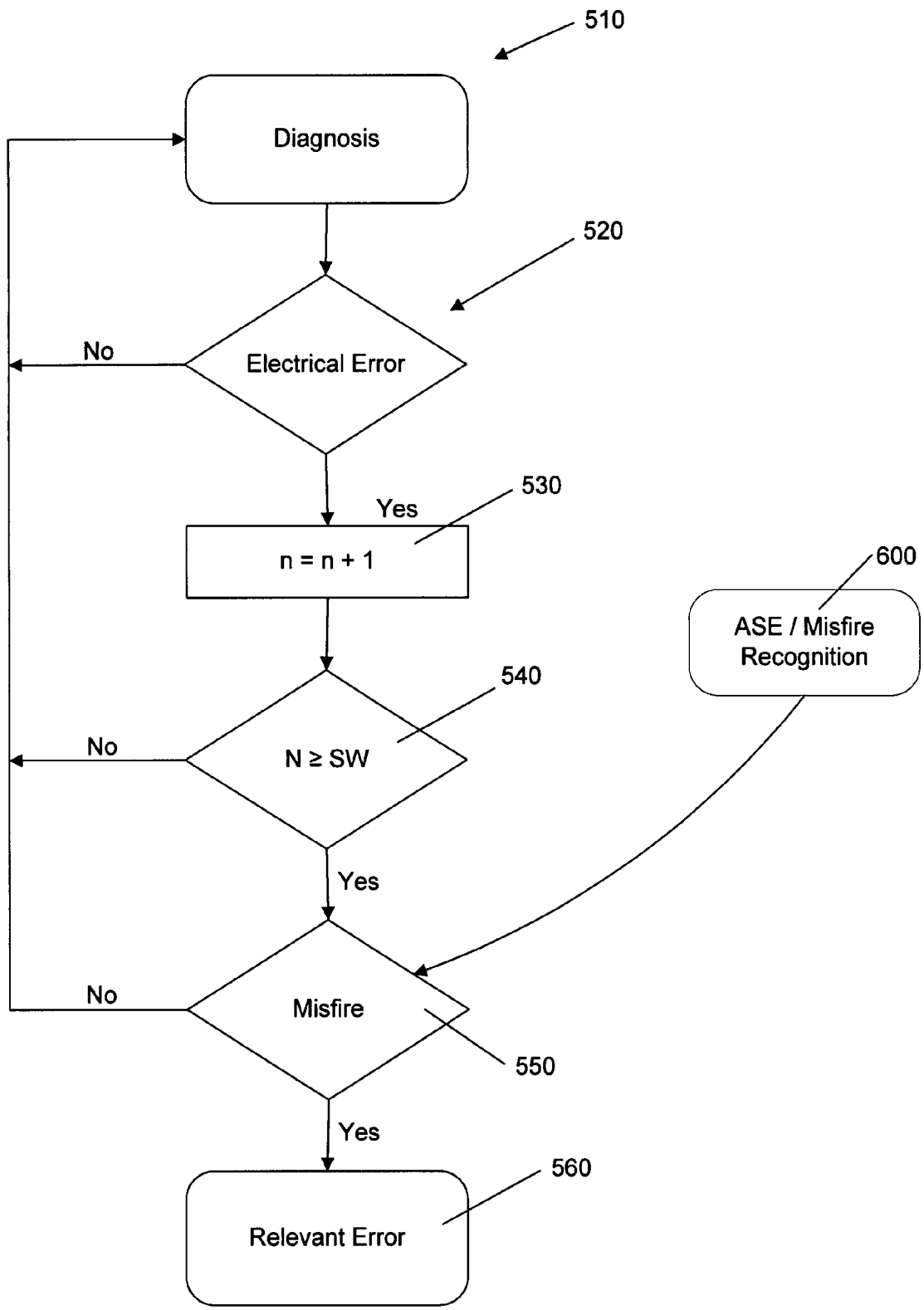
FIG. 3 shows schematically a flowchart of a procedure according to the invention.

FIG. 3 depicts schematically a flowchart of a procedure according to the invention. The diagnostic cycle depicted can, for example, be started by the diagnostic device itself or else by another functional module or a control unit. In the diagnostic step 510 a check of the output stage takes place, respectively of the electrical circuit for the operation of an actuator with regard to electrical errors. This can, for example, take place in a known manner, in that test voltages are impressed on the output stage, and the reaction to them is observed. In so doing, deviations from the expected performance suggest respective errors. If no error is detected, in the query step 520, reference is made back to the diagnostic step 510.

If an error were detected, an error counter n is incremented in step 530. This error counter can also, for example, be designed error specific, so that for each type of error a particular error counter is incremented.

A check is made in step 540 to see if the error counter n exceeds an established error threshold value SW. If this is not the case, reference is once again made to the diagnostic step 510, and the diagnosis resumes. If, however, the number n of the errors exceeds the error threshold value SW, a check is then made in step 550 to see if misfires are additionally to be observed. The results, respectively information or signals from a misfire recognition 600, are taken into account. If no misfires are to be observed, presumably a false diagnosis exists, and reference is made back to the diagnostic step 510.

If misfires are recognized, the diagnosis is considered to be true, and the error detected in step 560 is considered relevant; and if need be additional error reactions are initiated.

Figure 4:
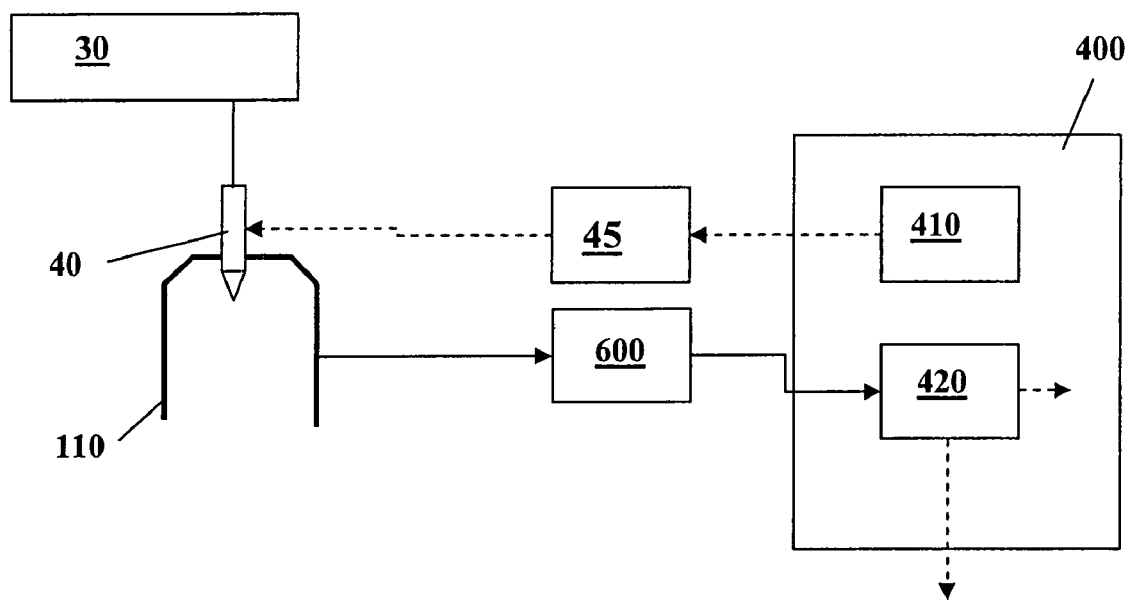
FIG. 4 shows schematically a device according to the invention.

FIG. 4 exemplifies an example of embodiment of a diagnostic device 400 according to the invention with a monitoring device 410 and an acquisition device 420. If a diagnosis has been initiated, the monitoring device 410 loads the output stage 45 with the appropriate test routines. The reactions to the test routines can, for example, be acquired directly by way of the monitoring device 410 or also via the acquisition device 420. Moreover, data, respectively information from a misfire recognition 600, is also acquired from the acquisition device 420 for the additional error diagnosis.

The evaluation of the acquired data can preferably be carried out by the diagnostic device 400 itself or else can be relayed to a control unit for further evaluation. The diagnostic device 400 can also additionally be part of a control unit or else also part of an output stage.

The invention claimed is:

1. A method of diagnosing an electrical error of a power output stage electrical circuit of a fuel injection valve configured to inject fuel into a cylinder of an internal combustion engine, the method comprising:
   periodically monitoring the power output stage electrical circuit of the fuel injection valve to detect an electrical error that originates from one of: an electromagnetic interference; and an electrical circuit failure;
   incrementing an error count value upon sensing said electrical error;
   comparing the error count value to an error threshold value;
   observing a crankshaft speed and a structure-borne noise characteristic of the internal combustion engine; and
   verifying the electrical error as a valid error upon an evaluation of:
      the error count value exceeding the error threshold value; and
      a deviation of at least one of the crankshaft speed and the structure-borne noise characteristic of the internal combustion engine; and
   deactivating the fuel injection valve when the electrical error has been verified as a valid error.

2. A method according to claim 1, further comprising operating the internal combustion engine in a limp home mode upon deactivating the fuel injection valve.

3. A machine-readable carrier for storing a computer program product with a program code to implement the method of claim 1, if the computer program product is executed on a computer or in a control unit.

* * * * *